(12) United States Patent
Kojima et al.

(10) Patent No.: US 6,445,217 B1
(45) Date of Patent: Sep. 3, 2002

(54) EDGE-TRIGGERED LATCH WITH BALANCED PASS-TRANSISTOR LOGIC TRIGGER

(75) Inventors: Nobuo Kojima, Austin; Kevin John Nowka, Round Rock; Huajun Wen, Austin, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/810,026

(22) Filed: Mar. 15, 2001

(51) Int. Cl.[7] .................................................. H03F 3/45
(52) U.S. Cl. ............................... 327/57; 327/51; 327/52
(58) Field of Search ................................ 327/197, 199, 327/200, 201, 208, 51, 52, 55, 57, 211, 212, 210, 218; 365/207, 205, 203, 233

(56) References Cited

U.S. PATENT DOCUMENTS

| | | | |
|---|---|---|---|
| 5,399,921 A | 3/1995 | Dobbelaere | 326/113 |
| 5,732,036 A | * 3/1998 | Merritt et al. | 365/203 |
| 5,825,224 A | 10/1998 | Klass et al. | 327/200 |
| 5,844,844 A | 12/1998 | Bauer et al. | 365/189.05 |
| 5,900,758 A | 5/1999 | Kanno | 327/201 |
| 5,949,266 A | * 9/1999 | Hinds et al. | 327/208 |
| 5,990,717 A | 11/1999 | Partovi et al. | 327/210 |
| 6,052,328 A | * 4/2000 | Ternullo, Jr. et al. | 365/233 |
| 6,060,927 A | 5/2000 | Lee | 327/218 |
| 6,111,444 A | 8/2000 | Mikan, Jr. et al. | 327/211 |
| 6,121,797 A | 9/2000 | Song et al. | 326/113 |
| 6,163,192 A | 12/2000 | Lee et al. | 327/212 |

OTHER PUBLICATIONS

U.S. patent application No. 09/810,027, Kojima et al., filed Mar. 15, 2001.

* cited by examiner

Primary Examiner—Tuan T. Lam
Assistant Examiner—Hiep Nguyen
(74) Attorney, Agent, or Firm—Casimer K. Salys; Bracewell & Patterson, L.L.P.

(57) ABSTRACT

An edge-triggered latch that incorporates pass-transistor logic (PTL) in the data and clock generation paths. In accordance with one embodiment, an edge-triggered latch includes a data input and at least one data path PTL transistor that passes data from the data input into a storage node in response to a latch trigger signal. A latch trigger circuit generates the latch-trigger signal in response to a clock signal transition.

4 Claims, 9 Drawing Sheets

(Amended)

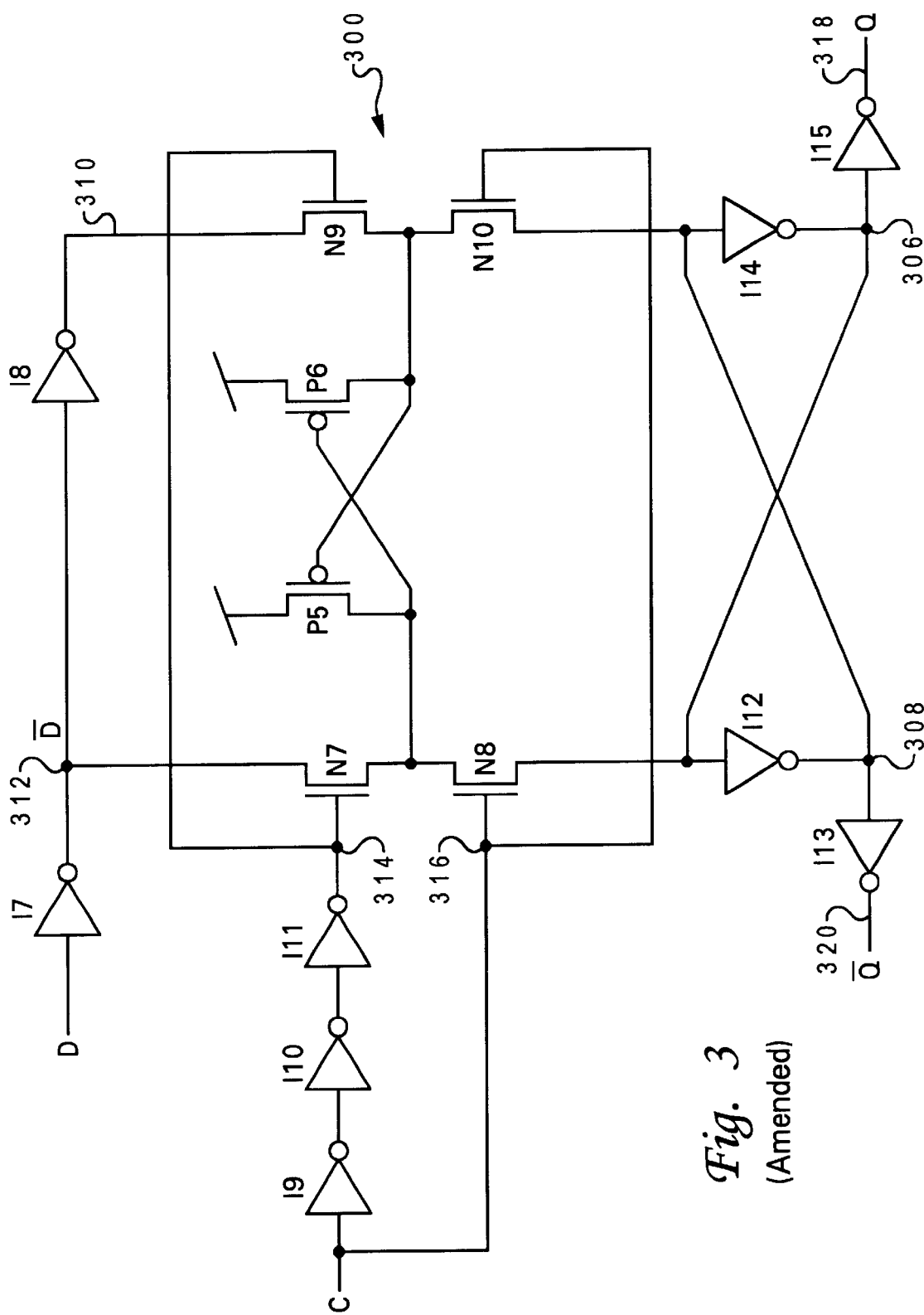
Fig. 3
(Amended)

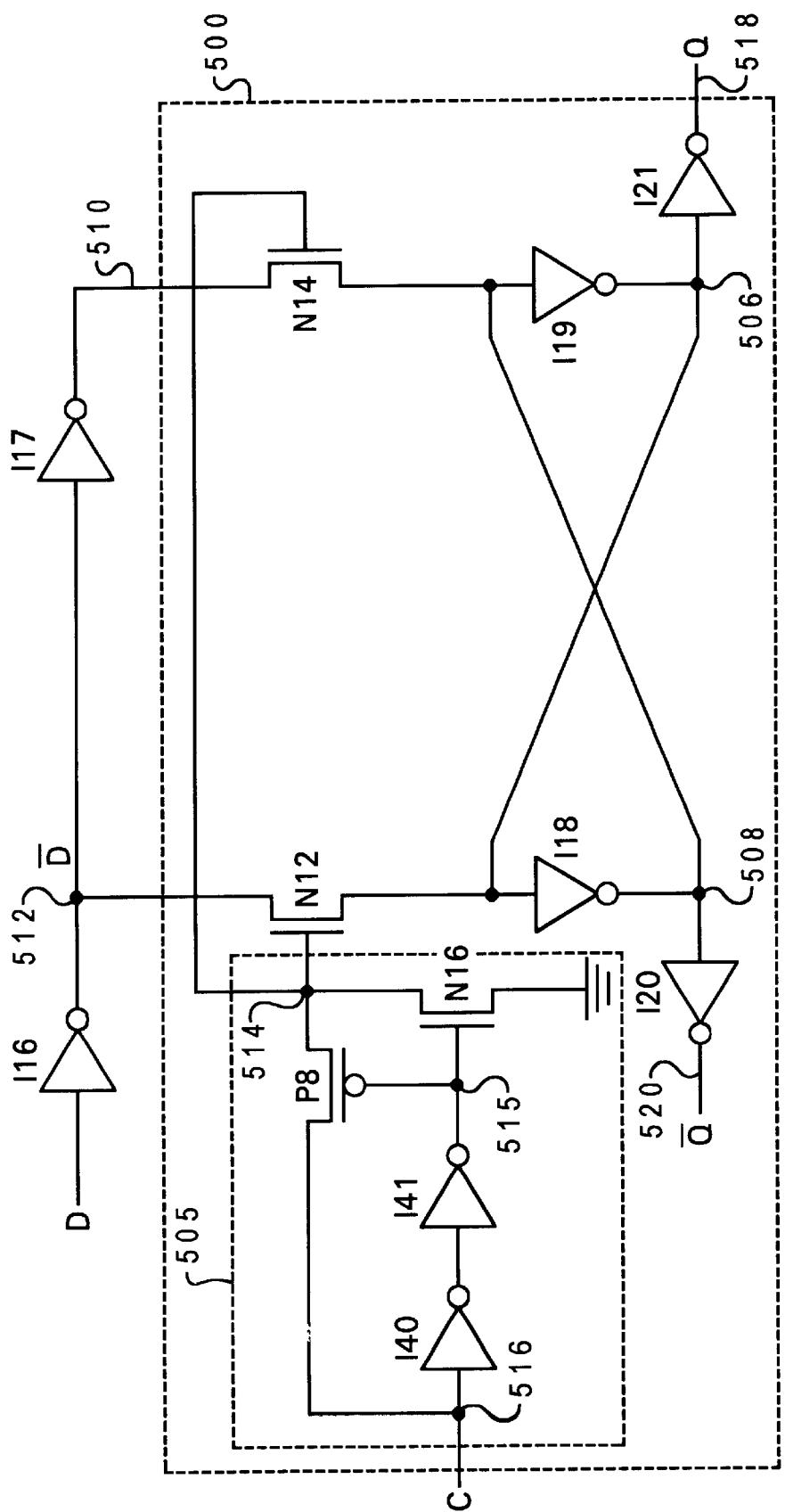
Fig. 5A
(Amended)

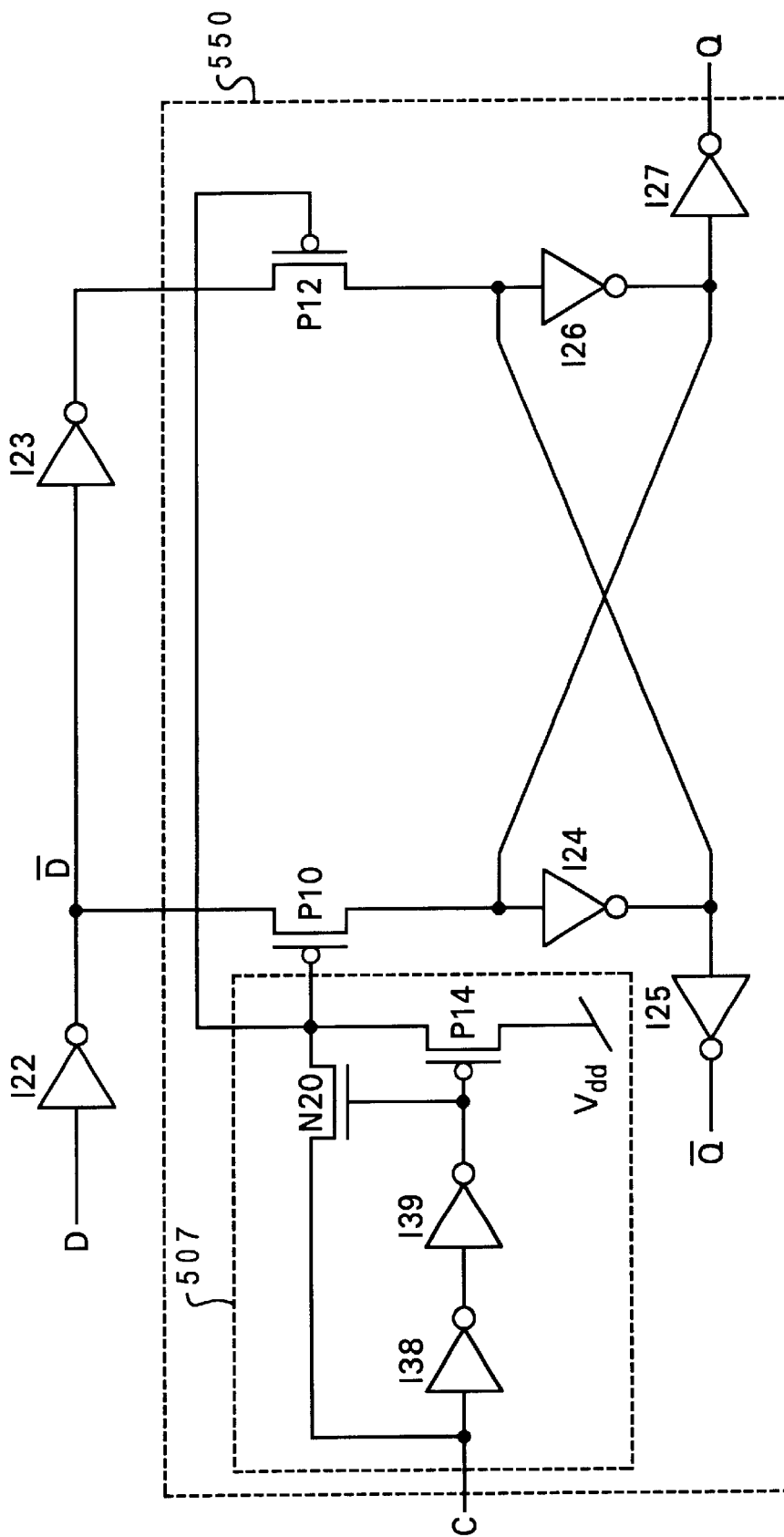
Fig. 5B
(Amended)

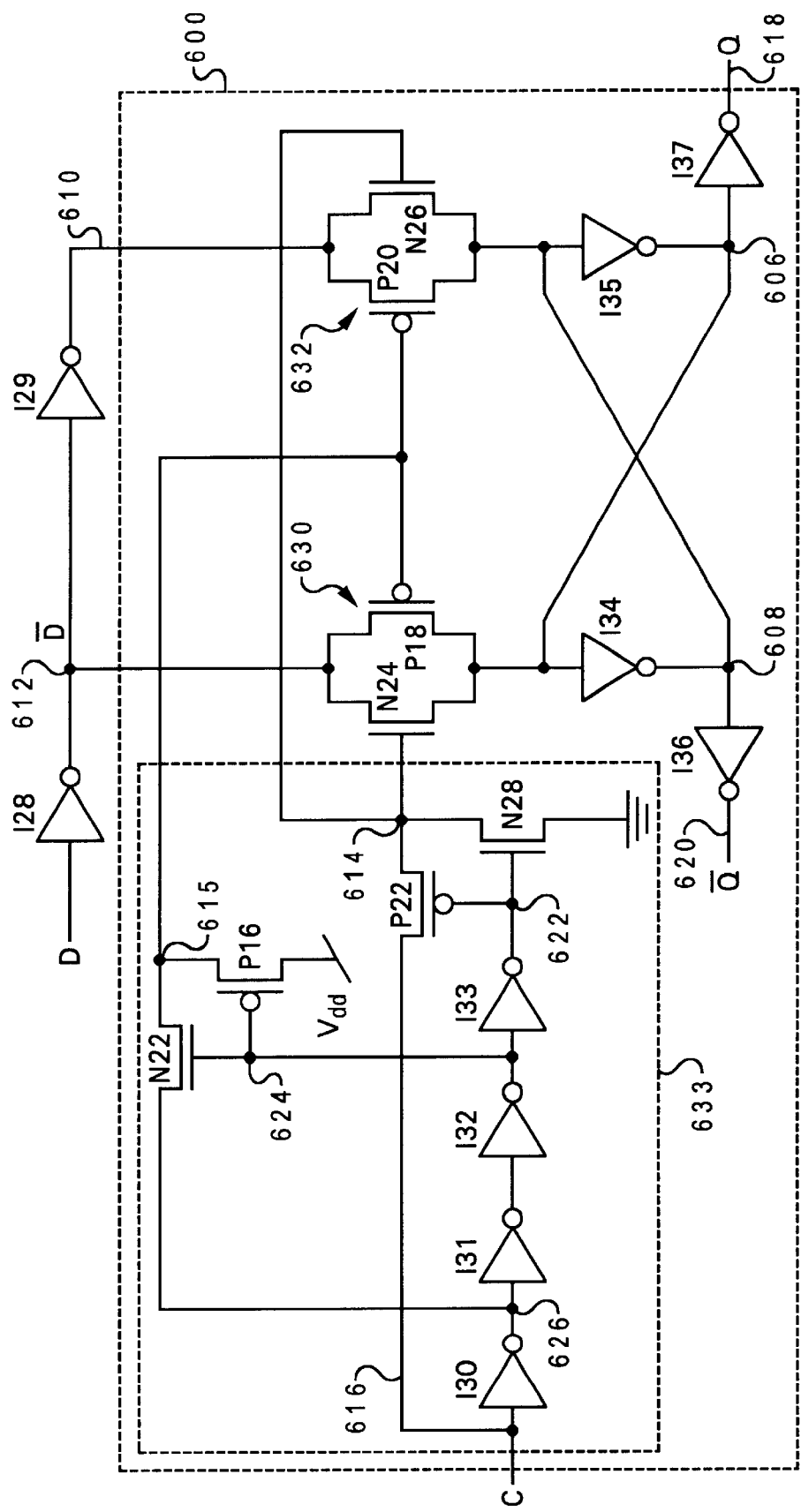
Fig. 6
(Amended)

EDGE-TRIGGERED LATCH WITH BALANCED PASS-TRANSISTOR LOGIC TRIGGER

CROSS REFERENCE TO RELATED APPLICATIONS

The present application is related to the following copending U.S. Patent Applications: U.S. patent application Ser. No. 09/810027 filed on Mar. 15, 2001, titled "Edge-Triggered Latch With Symmetric Complementary Pass-Transistor Logic Data Paths." The above mentioned patent application is assigned to the assignee of the present invention. The content of the cross referenced copending application is hereby incorporated herein by reference thereto.

BACKGROUND OF THE INVENTION

1. Technical Field

The present invention relates in general to storage devices within digital systems, and in particular to an improved edge-triggered latch that combines the data and clock generation path utilizing pass-transistor logic.

2. Description of the Related Art

Digital circuits, such as microprocessors and memory devices, typically use flip-flops as temporary storage devices. The most basic type of flip-flops operate with signal levels and are often referred to as latches. A latch with clock pulses as its control input is essentially a flip-flop that is triggered every time the clock pulse goes to a one or zero logic level. For ease of reference, it will be assumed that, as utilized herein, "latch" incorporates flip-devices and all clock-controlled latches.

Several categories of latches are known in the art including level-sensitive, master-slave, and edge-triggered. The present invention is directed to edge-triggered latch design. With reference to FIG. 1, there is depicted a conventional D-latch 100. In accordance with well-known D-latch design standards, D-latch 100 has two inputs, D (data) at a data input node 106, and C (control) at a clock input node 108. D-latch 100 generates a differential output at an output node 114 and a complementary output node 112. The outputs at nodes 112 and 114 cannot change state while the clock input at node 108 is at a logic 0 regardless of the value of D at data input node 106. A graphical representation of the input and output signals to and from D-latch 100 is provided in FIG. 2.

D-latch 100 is a positive edge-triggered latch, meaning that it triggers a data input at input node 106 only during a positive transition of a clock signal C. Two such positive clock signal transitions, 212 and 214, are depicted in FIG. 2. Pulse generating circuitry including Complementary Metal Oxide Semiconductor (CMOS) P-type Field Effect Transistors (PFETs) P2 and P3, and N-type Field Effect Transistors (NFETs) N3, N5, N4, and N6, is utilized to enable edge-triggered data propagation within D-latch 100 as follows.

Three CMOS inverters, I1, I2, and I3 produce a delayed complementary version of control signal C, illustrated in FIG. 2 as $\overline{C}_{dd}$. Control signal C is logically ANDed with its delayed complementary counterpart $\overline{C}_{dd}$ by series NFET pairs N3 and N5, and N4 and N6, to produce a data evaluation window having a width 210. The resulting data evaluation window is felt at a pair of pull-down nodes 118 and 120 at the sources of NFETs N1 and N2, respectively.

During a data evaluation window at pull-down nodes 118 and 120 data propagates through D-latch 100. At the onset of a data evaluation window (i.e., at a rising edge of C), the biasing at pull-down nodes 118 and 120 enables a pair of CMOS inverters comprising P1 and N1, and P4 and N2, respectively, to pass the input data through an internal data path node 104 and into a storage node 102. From storage node 102, the data propagates through inverter I6 to complementary output node 112 and through inverters I4 and I7 to output node 114. PFETs P2 and P3 suppress noise by maintaining a logic high at internal data path node 104 during non-data transfer cycles.

An ideal D-latch design provides a temporally symmetric complementary output as well as an optimized balance between performance and electrical efficiency. However, as illustrated in FIG. 2, the data path for Q is longer (four logic stages) than that for $\overline{Q}$ (three logic stages), resulting in an unbalanced differential output. In addition to having an unbalanced output, D-latch 100 suffers a reduced power efficiency due to periodic "glitches" experienced by internal data path node 104 wherein a high-to-low transition occurs for each clock cycle even in the absence of a change in the data input. Finally, the performance of D-latch 100 in terms of transfer speed is reduced by its CMOS edge-triggering design wherein additional clock pulse generating elements N3, N5, N4, and N6 are required to enable edge-triggered data propagation through the CMOS inverters in the data path.

From the foregoing, it can be appreciated that a need exists for an improved clock-triggered latch wherein the foregoing limitations of conventional latches are minimized.

SUMMARY OF THE INVENTION

An edge-triggered latch that incorporates pass-transistor logic (PTL) in the data and clock generation paths is disclosed herein. In accordance with one embodiment, an edge-triggered latch includes a data input and at least one data path PTL transistor that passes data from the data input into a storage node in response to a latch trigger signal. A latch trigger circuit generates the latch-trigger signal in response to a clock signal transition.

All objects, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3 illustrates an edge-triggered D-latch designed in accordance with one embodiment of the present invention;

FIG. 5A illustrates a positive edge-triggered D-latch having a pass-transistor logic triggering mechanism in accordance with an alternate embodiment of the present invention;

FIG. 5B depicts a negative edge-triggered D-latch having a pass-transistor logic triggering mechanism in accordance with an alternate embodiment of the present invention;

FIG. 6 illustrates an edge-triggered D-latch wherein transmission gate logic is combined with a pass-transistor logic triggering mechanism in accordance with an alternate embodiment of the present invention;

DETAILED DESCRIPTION OF THE PREFERRED EMBODIMENT

This invention is described in a preferred embodiment in the following description with reference to the figures. While this invention is described in terms of the best mode for achieving this invention's objectives, it will be appreciated by those skilled in the art that variations may be accomplished in view of these teachings without deviating from the spirit or scope of the present invention.

Figure 1:
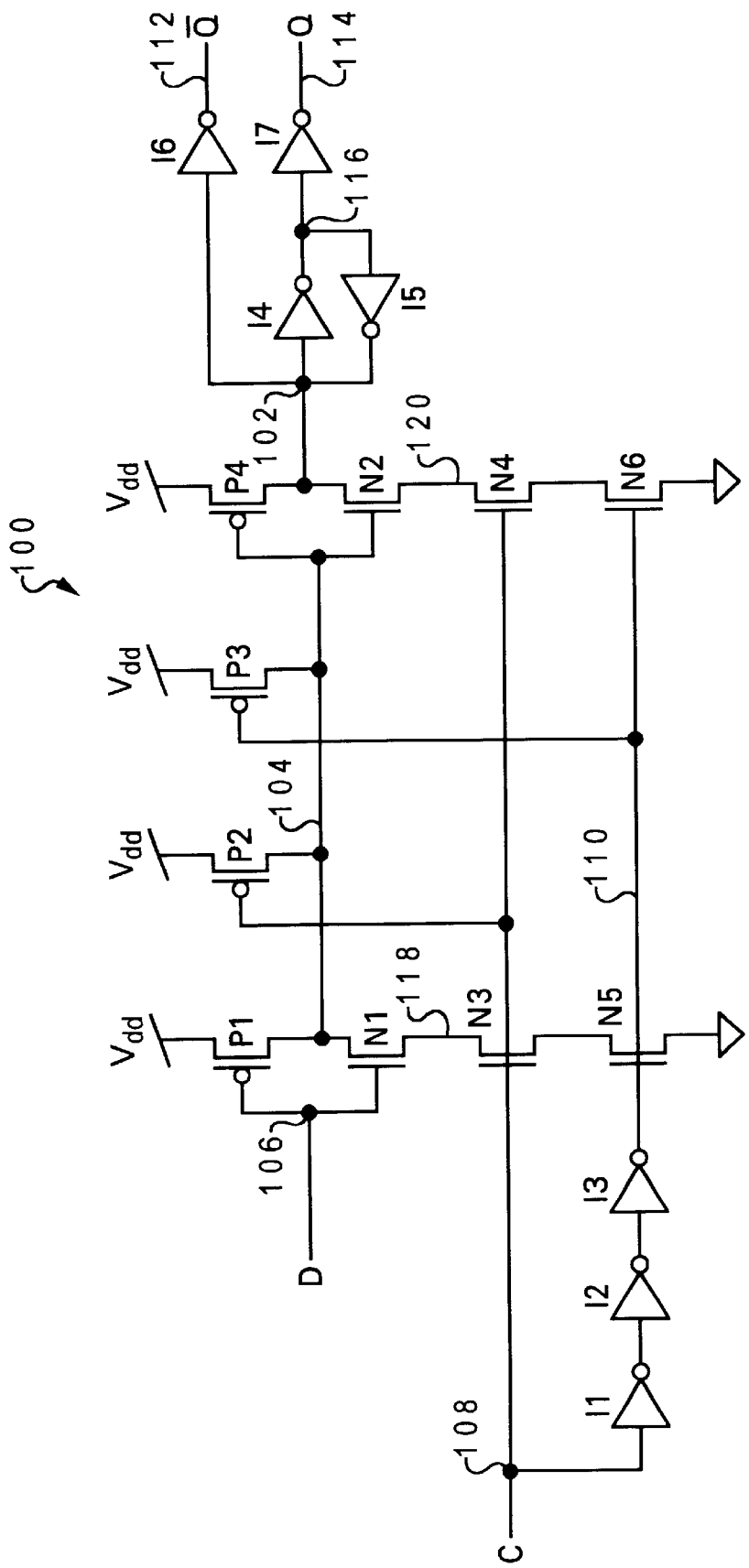
FIG. 1 illustrates a conventional edge-triggered D-latch.
Figure 2:
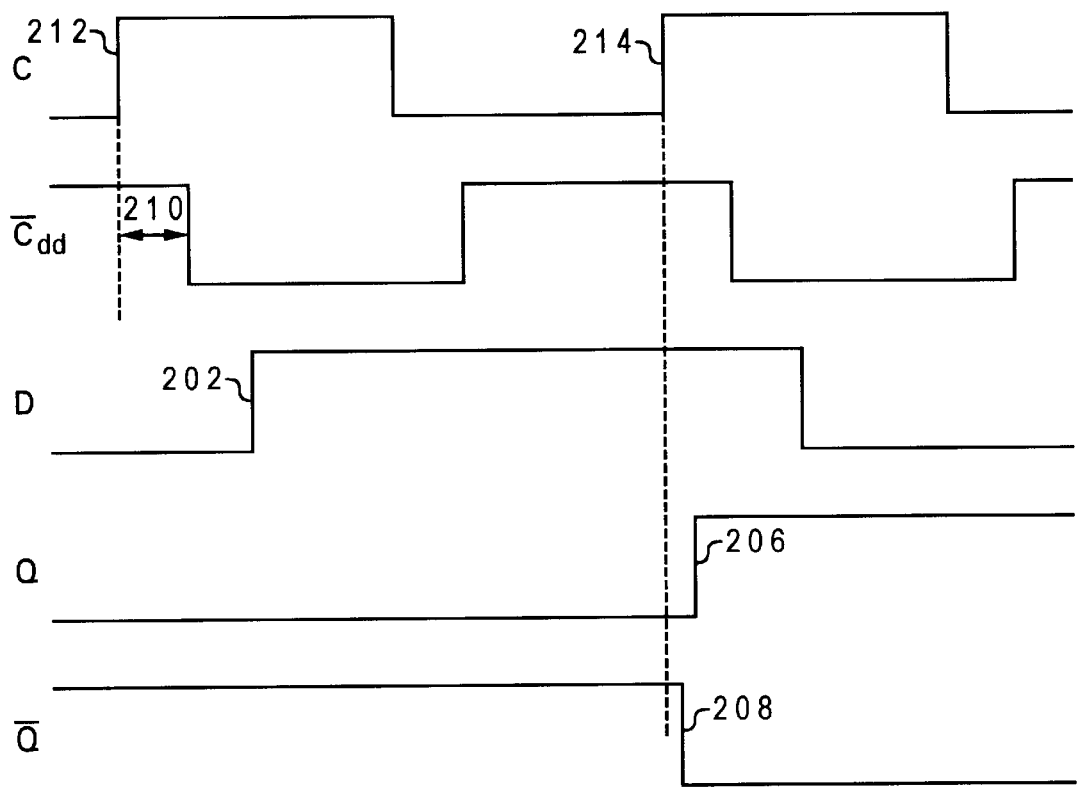
FIG. 2 is a timing diagram depicting the operation of the conventional D-latch shown in FIG. 1.

The present invention is directed to improving both the clock-to-output (C-to-Q) and data-to-output (D-to-Q) response for edge-triggered latches. Complementary Metal Oxide Semiconductor (CMOS) static logic design is employed in many latch designs. CMOS circuits consume less power and typically have higher performance in terms of switching speed that other N-channel Metal Oxide Semiconductor (NMOS) or P-channel Metal Oxide Semiconductor (PMOS) circuits. D-latch 100 in FIG. 1, is a static CMOS circuit wherein the latch data path from input node 106 to storage node 102 includes two inverters comprising NFET/PFET pairs N1/P1 and N2/P4. Complementary NFET/PFET design is also incorporated within the pull-up/pull-down clock pulse generating mechanism within D-latch 100 comprising P2, P3, N3, N5, N4, and N6.

An inherent problem with the CMOS design depicted in FIG. 1, however, is that a leakage current flows within each CMOS NFET/PFET complementary device pair when the FETs are simultaneously switched on by an input signal. Thus, for high-speed, low-power applications, CMOS design techniques often impose severe speed versus power tradeoffs, thereby limiting their design flexibility.

The present invention replaces conventional CMOS clock pulse triggering and data path propagation logic with a pass-transistor logic (PTL) configuration that provides improved power efficiency and data transfer speed as well as an optimally balanced differential output.

Figure 4:
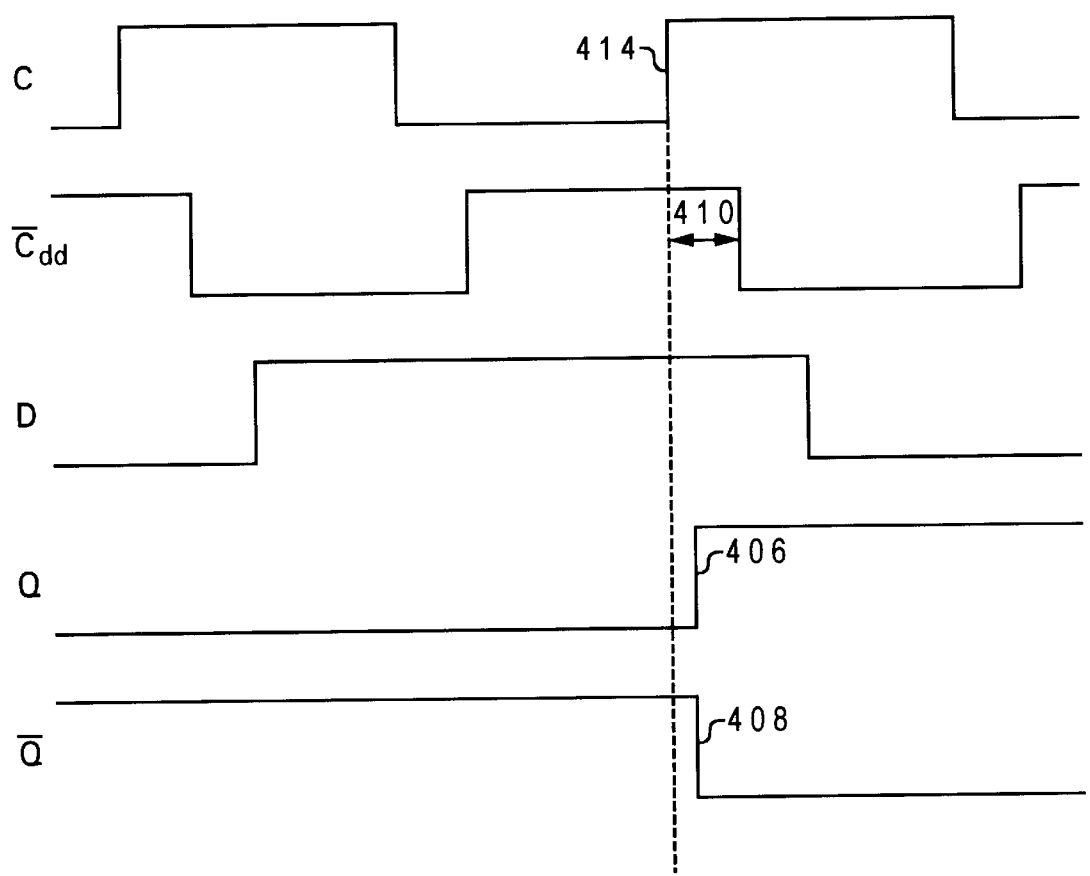
FIG. 4 is a timing diagram depicting the improved clock triggering performance realized by the edge-triggered D-latch shown in FIG. 3.

With reference to the figures, and in particular with reference to FIG. 3, there is illustrated an edge-triggered D-latch 300 designed in accordance with one embodiment of the present invention. As illustrated in FIG. 3, D-latch 300 receives differential inputs D and $\overline{D}$ from a pair of input nodes 310 and 312, respectively. A pair of CMOS inverters I7 and I8 are utilized to generate differential inputs D and $\overline{D}$. A clock signal C is input into D-latch 300 at a control input node 316. Three series-connected inverters I9, I10, and I11, invert and delay clock signal C, with the resultant signal $\overline{C}_{dd}$ being applied to a control input node 314. FIG. 4 illustrates the timing relationship between signals C and $\overline{C}_{dd}$.

In accordance with the depicted embodiment, pass-transistor logic (PTL) NFETs N7, N8, N9, and N10 are incorporated within the data paths for D-latch 300. As depicted in FIG. 3, delayed inverted clock signal $\overline{C}_{dd}$ provides the gate control input for NFETs N7 and N9 at control input node 314, while clock signal C provides the gate control input for NFETs N8 and N10 at control input node 316. Under the control of C and $\overline{C}_{dd}$, NFETs N7, N8, N9, and N10 serve as pass-gates with respect to the differential data inputs.

NFET pairs N7 and N8, and N9 and N10, are source-to-drain connected such that the clock signal at control input node 316 is logically ANDed with the delayed inverted clock signal at node 314. As illustrated in FIG. 4, a positive edge-triggered data evaluation window having a width 410 results during which data at differential input nodes 310 and 312 propagates through pass-gate NFET pairs N7 and N8, and N9 and N10 into a pair of storage nodes 306 and 308, respectively. A pair of source-to-gate cross-coupled PFETs P5 and P6 are employed as keepers within D-latch 300 to facilitate rising edge transitions for the pass-gate NFETS. The present invention thus incorporates pass-gate transistors N7, N9, N8, and N10 as active components within the latch triggering mechanism for D-latch 300 since the data evaluation window 410 is a combined effect of the control signals applied to the gates of N7, N9, N8, and N10.

With continued reference to FIGS. 3 and 4, upon the occurrence of a rising edge 414 of clock signal C, pass-gate NFETS N7, N9, N8, and N10 are simultaneously opened, thus enabling differential inputs D and $\overline{D}$ to propagate to a storage nodes 306 and 308, respectively. From storage nodes 306 and 308, the data values are output to a pair of differential output nodes 318 and 320 as Q and $\overline{Q}$, respectively. It should be noted that the delay between the rising edge of clock signal C 414 and the edge transitions of Q and $\overline{Q}$ at 406 and 408 is significantly reduced in comparison to the analogous delay between the rising edge of clock signal C 214 and the transitions of the differential Q-outputs of conventional D-latch 100 in FIG. 1. It should be further noted that the differential outputs Q and $\overline{Q}$ are temporally balanced as a result of the symmetric data path design of D-latch 300.

As illustrated in FIG. 3, the data input D follows a first data path comprising NFET pair N9 and N10, while the complementary data input $\overline{D}$ follows a parallel data path comprising NFET pair N7 and N8. In an important feature of the depicted embodiment, it should be noted that the delayed inverted clock signal $\overline{C}_{dd}$ is applied as the control input for the first pass-gate transistor within each of the first and second data paths (i.e., NFETs N7 and N9), while the clock signal C is applied as the control input for the second pass-gate transistor within each of the first and second data paths (i.e., NFETs N8 and N10). This ordering of the application of $\overline{C}_{dd}$ and C to the pass-gates is required to ensure that data is only evaluated at the rising edge of C.

With reference to FIG. 5A, there is illustrated a positive edge-triggered D-latch 500 having a PTL latch trigger circuit in accordance with an alternate embodiment of the present invention. As depicted in FIG. 5A, D-latch 500 includes a clock input C at node 516 and differential data inputs D and $\overline{D}$ at nodes 510 and 512, respectively. In embodiment depicted in FIG. 5A, the latch trigger circuit for D-latch 500 is a pulse generator 505 that generates a pulse at low-to-high clock signal transitions.

Figure 7:
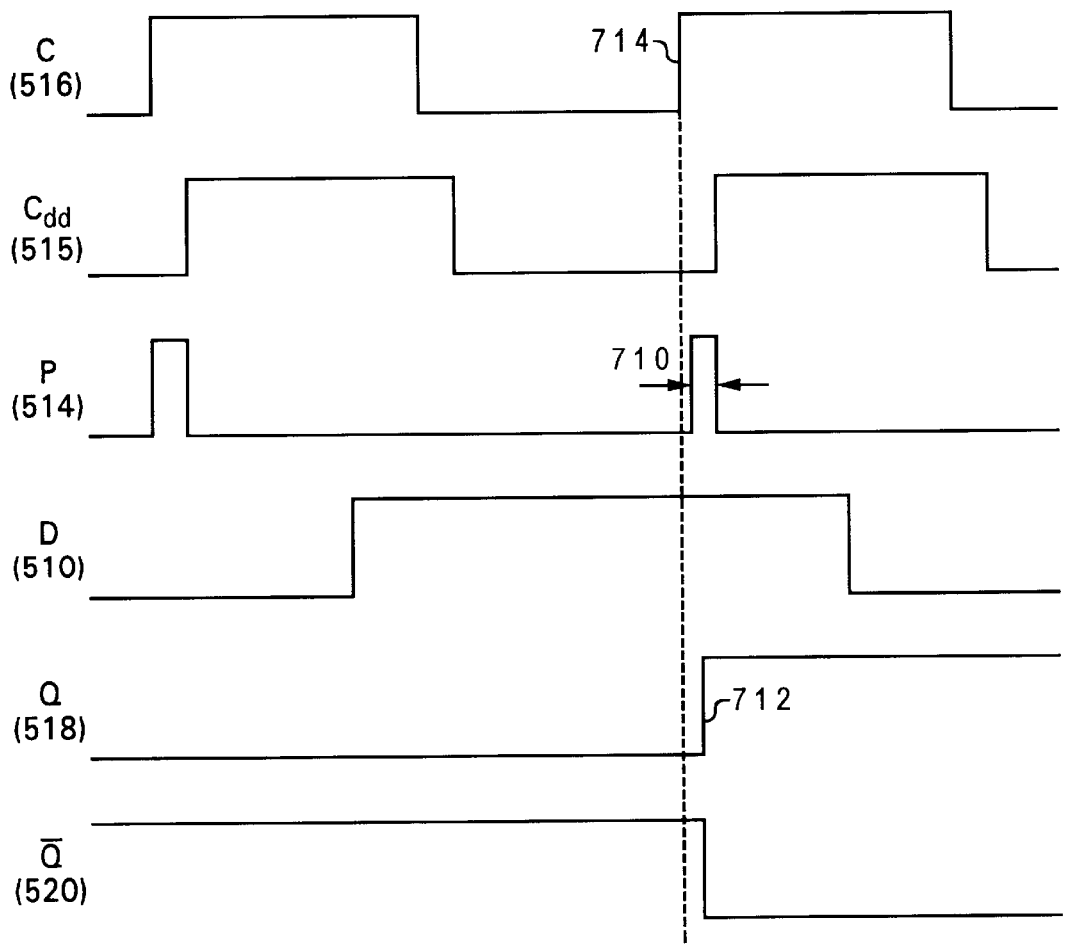
FIG. 7 is a timing diagram depicting the improved clock triggering performance realized by the edge-triggered D-latch shown in FIG. 5A.

As further illustrated in FIG. 5A, D-latch 500 receives differential inputs D and $\overline{D}$ from a pair of input nodes 510 and 512, respectively. A pair of CMOS inverters I16 and I17 are utilized to generate differential inputs D and $\overline{D}$. A clock signal C is input into D-latch 500 at a control input node 516. PTL NFETs N14 and N12 are incorporated as pass-gates within the data paths for D-latch 500. Data path NFETs N14 and N12 are controlled by a latch trigger pulse applied from pulse generator 505 to a single control node 514. As illustrated in FIG. 7, a latch control pulse 710 is generated at control node 514 to permit the differential data input at nodes 510 and 512 to propagate through pass-gate NFETs N14 and N12 into a pair of storage nodes 506 and 508, respectively.

Pulse generator 505 includes clock input node 516, which serves as an input to a pair of series-connected inverters I40 and I41. Referring back to FIG. 7, latch control pulse 710 at control node 514 has a pulse width that corresponds to the delay imparted on clock signal C by inverters I40 and I41. The delayed version of clock signal C at node 515 is depicted in FIG. 7 as delayed clock signal $C_{dd}$. It can be further seen from FIG. 7 that the resultant triggering pulses passed from pulse generator 505 to control node 514 are asserted at the rising edge of clock signal C and deasserted at the rising edge of delayed clock signal $C_{dd}$.

Pulse generator 505 further includes a PFET P8, which serves as a pass-gate for transmitting portions of clock signal C from clock input node 516 to control node 514 in accordance with the delayed clock $C_{dd}$ applied to the gate terminal of PFET P8 at node 515. A pass-gate NFET N16 is also incorporated within pulse generator 505 to generate latch control pulse 710 at control node 514.

FIG. 7 depicts an exemplary pulse generation operation implemented by PFET P8 and NFET N16 as follows. While delayed clock signal $C_{dd}$ at node 515 is at a logic level high, PFET P8 is switched off, thus preventing clock signal C from reaching control node 514. In addition, a logic high at node 515 switches NFET N16 on, thus enabling NFET N16 to pass ground (logic low) to control node while PFET P8 is being switched off. When delayed clock signal $C_{dd}$ transitions to a logic level low, NFET N16 switches off and PFET P8 switches on to permit clock signal C to propagate to control node 514. The overlapping portion of a low $C_{dd}$ and a high C is captured by latch trigger transistors PFET P8 and NFET N16 to produce a latch control pulse at control node 514 having a rising edge that corresponds to the rising edge of C.

The resultant positive-level pulses at control node 514 are applied to the gate terminals of data path pass-gate NFETs N14 and N12, resulting in the differential data inputs at nodes 510 and 512 being sampled only in response to rising edge clock transitions.

With continuing reference to FIG. 7 in conjunction with FIG. 5A, upon the occurrence of latch control pulse 710, pass-gate NFETS N14 and N12 are simultaneously opened, thus enabling differential inputs D and $\overline{D}$ to propagate to a storage nodes 506 and 508, respectively. From storage nodes 506 and 508, the data values are output to a pair of differential output nodes 518 and 520 as Q and $\overline{Q}$, respectively.

It should be noted that the delay between the rising edge of clock signal C 714 and the edge transitions of Q and $\overline{Q}$ at 506 and 508 are significantly reduced in comparison to the analogous delay between the rising edge of clock signal C 214 and the transitions of the differential Q-outputs of conventional D-latch 100 in FIG. 1. It should be further noted that due to the pulse triggering functionality of the latch trigger circuit for D-latch 500, only one pass-gate transistor is required for each data path, thus substantially reducing the data-to-output (D-to-Q) propagation time.

An alternative embodiment of D-latch 500 wherein negative (high-to-low) pulses are employed as the latch triggering mechanism is illustrated in FIG. 5B. A D-latch 550 is illustrated, which incorporates pass-gate PFETs P10 and P12 rather than NFETs into the differential data paths. The device polarity for the pulse generator 507 is also reversed for D-latch 550.

With reference to FIG. 6, there is depicted an edge-triggered D-latch 600 wherein transmission gate logic is combined with a pass-transistor logic triggering mechanism in accordance with an alternate embodiment of the present invention. A differential data input comprising data D and inverted data D at nodes 610 and 612, respectively, is generated by inverters I28 and I29. As with D-latches 500 and 550, D-latch 600 includes a single pass-data stage that is controlled by a latch trigger circuit.

The pass-data stage for D-latch 600 comprises a pair of transmission gates 630 and 632. In accordance with conventional transmission gate design, transmission gates 630 and 632 comprise NFET/PFET pairs N24/P18 and N26/P20, respectively. The latch trigger circuit for D-latch 600 generates a control input for the transmission gates at control nodes 614 and 615. A simultaneous logic low at node 615 and logic high at node 614 switches transmission gates 630 and 632 on and permits the differential data to propagate to a pair of storage nodes 606 and 608.

The latch trigger circuit for D-latch 600 is a differential pulse generator 633 which includes a set of series-connected inverters I30, I31, I32, and I33 that receives a clock signal input at a clock source node 616. Differential pulse generator input 633 further comprises two NFET/PFET pass-gate pairs, N28/P22 and N22/P16, which generate latch trigger pulses at control nodes 614 and 615. As depicted in FIG. 6, PFET P22 serves as a pass-gate for transmitting portions of clock signal C from clock input node 616 to control node 614 in accordance with a delayed clock applied at node 622 to the gate terminal of PFET P22. A pass-gate NFET N28 shares delayed output node 622 and control node 614 with the input and control pass-gate terminals of PFET P22.

Figure 8:
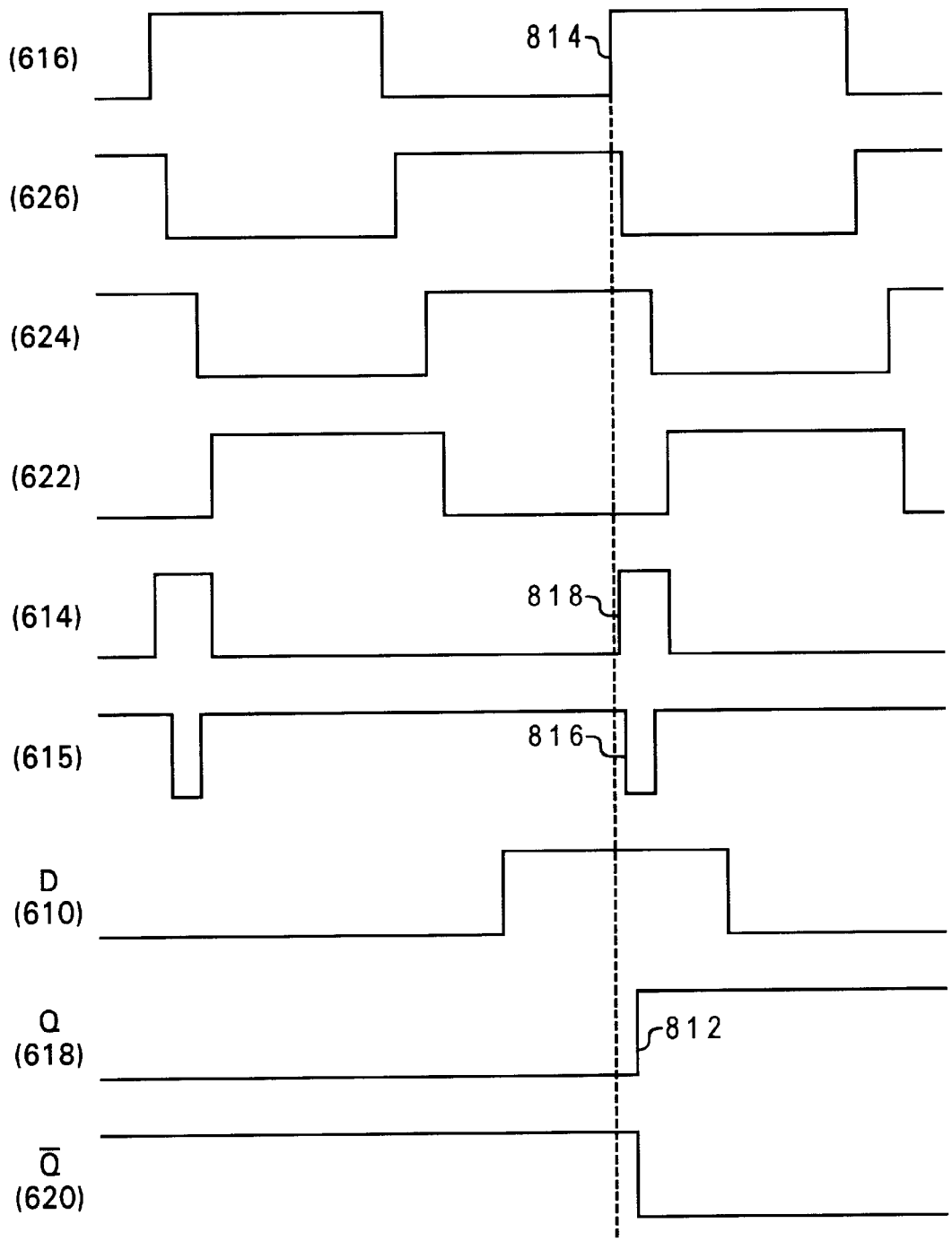
FIG. 8 is a timing diagram depicting the improved clock triggering performance realized by the edge-triggered D-latch shown in FIG. 6.

Referring to FIG. 8 in conjunction with FIG. 6, the operation of the trigger circuit for D-latch 600 is exemplified. NFET/PFET pair N22/P16 generates a latch control signal at control node 615 that switches data path PFETs P18 and P20 on or off. The clock signal C at node 616 propagates through inverter I30 to produce a delayed inverted signal at node 626, which is applied to the drain terminal of pass-gate NFET N22. The control signal applied to the gate terminals of N22/P16 for passing the signal at node 626 through NFET N22 into latch control node 615 is obtained after the clock signal is further delayed through a pair of inverters I31 and I32.

The complementary transmission gate control signal for data path NFETs N24 and N26 is generated by NFET/PFET pair N28/P22 at control node 614. As depicted in FIG. 8, the latch control pulse at node 614 coincides with the overlap of a high clock signal C at node 616 and a low delayed clock signal at node 622. Differential pulse generator 633 thus produces a positive (low-to-high) pulse at control node 614 and a negative (high-to-low) pulse at control node 615 to enable data to pass through transmission gates 630 and 632. As explained below the generation of the latch trigger pulses occurs in response only to a rising clock edge at clock input node 616.

The generation of a latch trigger window commences with a positive transition 814 of clock signal C at node 616. A pulse having a rising edge 818 is generated at control node 614 until the delayed clock signal at node 622 transitions to a logic high. The pulse width of the pulse at control node 614 is delimited by the rising edge of the delayed clock signal at node 622. Also initiated by the rising edge 814 of clock signal C, a negative pulse is generated within the rising and falling boundaries of the generated positive pulse. A logic high at node 624 enables pass-gate NFET N22 to pass the falling edge of delayed clock signal 626 to control node 615 as falling edge 816.

It should be noted that the delay between the rising edge of clock signal C at node 616 and the edge transition of Q at 812 is significantly reduced in comparison to the analogous delay between the rising edge 214 of clock signal C and the transitions of the differential Q-outputs of conventional D-latch 100 in FIG. 1. It should be further noted that the symmetric control and data paths of D-latch 600 result in balanced C-to-Q and D-to-Q responses. Furthermore, the pulse generation functionality provided by the latch trigger circuit within D-latch 600 allows for a simplified data path wherein only a single transmission gate in each of the differential data paths is required for each data path, thus substantially reducing the data-to-output (D-to-Q) propagation time.

While the invention has been particularly shown and described with reference to a preferred embodiment, it will be understood by those skilled in the art that various changes in form and detail may be made therein without departing from the spirit and scope of the invention.

What is claimed is:

1. An edge-triggered latch comprising:

a pair of complementary data inputs;

at least one pass-transistor logic (PTL) transmission gate configured as a pass-gate with respect to each of said pair of complementary data inputs and having a pair of gate terminals connected to a first and second control node, wherein said at least one PTL transmission gate passes data from said pair of complementary data inputs into a pair of complementary storage nodes in response to a differential latch trigger pulse applied to said first and second control nodes; and a differential pulse generator including a first and a second latch trigger PTL transistor that pass said differential latch trigger pulse to said first and second control nodes in response to a clock signal transition.

2. The edge-triggered latch of claim 1, wherein said at least one PTL transmission gate comprises an N-type field-effect transistor and a P-type field-effect transistor, and wherein the gate of said N-type field-effect transistor is coupled to said first control node and the gate of said P-type field effect transistor is coupled to said second control node.

3. The edge-triggered latch of claim 2, wherein said differential latch trigger pulse comprises a positive level pulse and a negative level pulse, and wherein said differential pulse generator comprises:

a positive pulse generator for generating said positive level pulse; and a negative pulse generator for generating said negative level pulse.

4. The edge-triggered latch of claim 3, wherein said positive pulse generator is coupled to said first control node and said negative pulse generator is coupled to said second control node.

* * * * *